United States Patent [19]

Wermuth

[11] 4,190,806
[45] Feb. 26, 1980

[54] CIRCUIT ARRANGEMENT FOR THE SELECTIVE COMPRESSION OR EXPANSION OF THE DYNAMIC RANGE OF A SIGNAL

[75] Inventor: Jürgen Wermuth, Peine-Stederdorf, Fed. Rep. of Germany

[73] Assignee: Licentia Patent-Verwaltungs-G.m.b.H., Frankfurt am Main, Fed. Rep. of Germany

[21] Appl. No.: 943,978

[22] Filed: Sep. 20, 1978

[30] Foreign Application Priority Data

Oct. 1, 1977 [DE] Fed. Rep. of Germany ....... 2744249

[51] Int. Cl.² .............................................. H04B 1/64
[52] U.S. Cl. ...................................... 330/51; 330/85; 330/109; 330/151; 333/14

[58] Field of Search ................... 330/51, 85, 107, 109, 330/110, 151; 333/14

[56] References Cited

U.S. PATENT DOCUMENTS

| | | | |
|---|---|---|---|
| 3,631,365 | 12/1971 | Dolby | 333/14 |
| 3,769,612 | 10/1973 | Yamazaki | 333/14 |
| 3,911,371 | 10/1975 | Nakamura et al. | 330/109 X |
| 3,983,505 | 9/1976 | Ishigaki et al. | 330/85 X |

*Primary Examiner*—James B. Mullins
*Attorney, Agent, or Firm*—Spencer & Kaye

[57] ABSTRACT

A compander system is described, in which the 'compression' and 'expansion' modes are established by the selective use of a compression or expansion circuit as such or as a negative feed-back branch for a back-coupled amplifier.

9 Claims, 5 Drawing Figures

CIRCUIT ARRANGEMENT FOR THE SELECTIVE COMPRESSION OR EXPANSION OF THE DYNAMIC RANGE OF A SIGNAL

BACKGROUND OF THE INVENTION

The invention relates to a circuit arrangement for selective compression or expansion of the dynamic range of a signal.

Such a circuit arrangement must frequently include a signal input terminal and in some cases only one output terminal. There are also necessary switch means that connect the input terminal and the output terminal or terminals of the circuit arrangement selectively to the individual circuit parts according to the mode of operation (compression or expansion).

In such a case it is required that the switch means to be used are not too expensive and that during switchover from compression to expansion and vice versa as small switching disturbances as possible occur. These switching disturbances arise for example because, during the switching over operation, indefinite operating conditions of the associated circuit arrangement occur.

SUMMARY OF THE INVENTION

An object of the invention is to provide a circuit arrangement in which switching over between the 'compression' and 'expansion' modes is possible with a low expenditure for the switch means and with the mitigation of switching disturbances.

According to the invention, there is provided a circuit arrangement for the selective compression or expansion of the dynamic range of a signal having:

an amplifier, provided with a negative feed-back path for limiting the gain of the amplifier to a preset value, and having an input for receiving the signal, a dynamic range modification circuit, having a low output impedance, connected to the output of the amplifier, and switching means arranged to selectively connect the modification circuit in parallel with the negative feed-back path and in series with the amplifier.

BRIEF DESCRIPTION OF THE DRAWINGS

The invention will be explained in more detail with reference to several practical examples which are illustrated in the drawings, in which FIGS. 1 to 4 each show a practical example of the invention.

DESCRIPTION OF THE PREFERRED EMBODIMENTS

Figure 1:
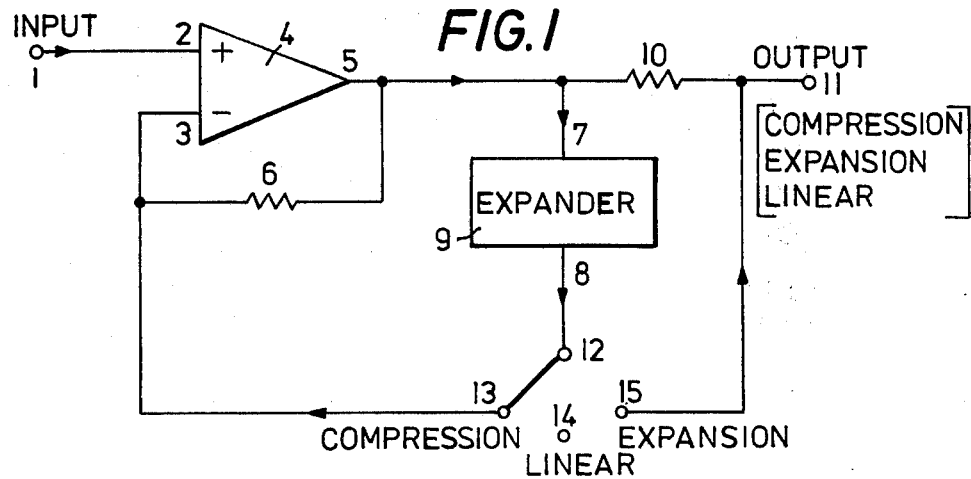

The circuit according to FIG. 1 shows a circuit arrangement which is provided for selective dynamic compression or expansion. For both the 'compression' and 'expansion' modes of operation only one input terminal 1 and one output terminal 11 are provided. By means of a switch means, which is constructed as a selector switch 12 having three positions or settings 13, 14 and 15, a third 'linear' mode of operation can additionally be switched on (at setting 14 of the selector switch 12). This 'linear' mode of operation means that the compression or expansion action of the circuit arrangement described is switched off; only a linear circuit arrangement, which in the present case has the amplification 1, is then connected between the input terminal 1 and the output terminal 11.

The useful signal, e.g. a LF signal, to be varied in its dynamic range as required, is fed from the input terminal 1 to the non-inverting input 2 of an amplifier 4 constructed as a differential amplifier. The inverting input 3 of this amplifier 4 is connected to the output 5 of the amplifier 4 via a direct current negative feed-back path which includes a resistor 6. The amplifier 4 is advantageously constructed so that its output 5 operates as a voltage source with a low ohmic output resistance. To the output 5 of the amplifier 4 is connected the input 7 of an auxiliary circuit 9. The auxiliary circuit 9 is so constructed that its output 8 has very low ohmic output resistance in the manner of a voltage source. In the ideal case the output resistance of such a voltage source has an output resistance of zero ohm. This may be substantially effected by the output stage of the auxiliary circuit 9 being formed by an amplifier of relatively high gain and a large amount of negative feed-back; for such a purpose a commercially available amplifier with a very high no-load amplification and a strong feed-back may be used.

When the selector switch 12 is in the compression setting 13, the output 8 of the auxiliary circuit 9 is connected in parallel with the feed-back resistor 6 by the output 13 of the selector switch 12 being connected to the inverting input 3 of the amplifier 4.

In the present case the auxiliary circuit 9 is constructed as an expansion circuit or expander whereby the useful signal on the input 7 of the auxiliary circuit 9 appears at the output 8 thereof with an increased dynamic range. In the setting 13 of the selector switch 12 described and illustrated in the drawing the auxiliary circuit 9 is in the negative feed-back path of the amplifier 4, so that the expansion action of the auxiliary circuit 9 acts as compression relative to the partial circuit that includes the amplifier 4 and the auxiliary circuit 9. Hence the useful signal that can be taken off at the output 5 of the amplifier 4 has a reduced dynamic range relative to the useful signal fed to the input terminal 1.

Since the auxiliary circuit 9 has a relatively very low ohmic output resistance, the feed-back resistor 6 has, in the described setting 13 of the selector switch 12, practically no influence on the action of the auxiliary circuit 9. A negative feed-back voltage extending via the feed-back resistor 6 from the output 5 of the amplifier 4 to its inverting input 3 is correspondingly short-circuited by the very low ohmic output resistance of the auxiliary circuit 9. Therefore, the expansion circuit in the auxiliary circuit 9 effects a corresponding compression action in the case of the negative feed-back amplifier 4, the continuously connected feed-back resistor 6 exerting no disturbing action.

The output 5 of the amplifier 4 is connected via an output resistor 10 to the output terminal 11, so that in the 'compression' setting 13 of the selector switch 12 a circuit arrangement acting as a compression circuit is located between the input terminal 1 and the output terminal 11.

If the selector switch 12 is brought into the expansion setting 15, the amplifier 4 has a fixed amplification owing to the feed-back resistor 6, the amplification being equal, or nearly equal, to 1. Hence there appears at the output 5 of the amplifier 4 a useful signal the dynamic range of which is substantially uninfluenced. The useful signal then passes to the output terminal 11 via the auxiliary circuit 9, the output 8 of which, in the setting 15 of the selector switch 12, is connected to the output terminal 11.

It will be appreciated that in this case (setting 15 of the selector switch 12) the dynamic range of the useful signal between the input terminal 1 and the output terminal 11 is influenced only by the auxiliary circuit 9. Since the auxiliary circuit 9 behaves like an expansion circuit, there can be taken off, at the output terminal 11, a useful signal the dynamic range of which relative to the dynamic range of the useful signal at the input terminal 1 is increased, i.e. expanded.

Since the output resistance of the auxiliary circuit 9—as stated previously—has a very low value of resistance, in the setting 15 of the selector switch 12, the described behavior of the illustrated circuit arrangement is practically uninfluenced by the resistor 10 arranged in parallel with the auxiliary circuit 9. Influencing of the mode of operation of the auxiliary circuit 9 by the resistor 10 is reduced as the output resistance of the auxiliary circuit 9 relative to the resistance of the resistor 10 is made smaller. The resistor 10 has the effect that the auxiliary circuit 9 is not short-circuited with the selector switch 12 in the setting 15.

The selector switch 12 may be brought into a further setting 14 ('linear') in which the output 8 of the auxiliary circuit 9 is not connected either to the input of the amplifier 4 nor to the output terminal 11. In this case there can be taken off at the output terminal 11 a useful signal which has the same dynamic range as the useful signal fed to the input terminal 1. This 'linear' mode of operation is inter alia always used when the compander action of the circuit arrangement described is to be switched out.

Figure 2:
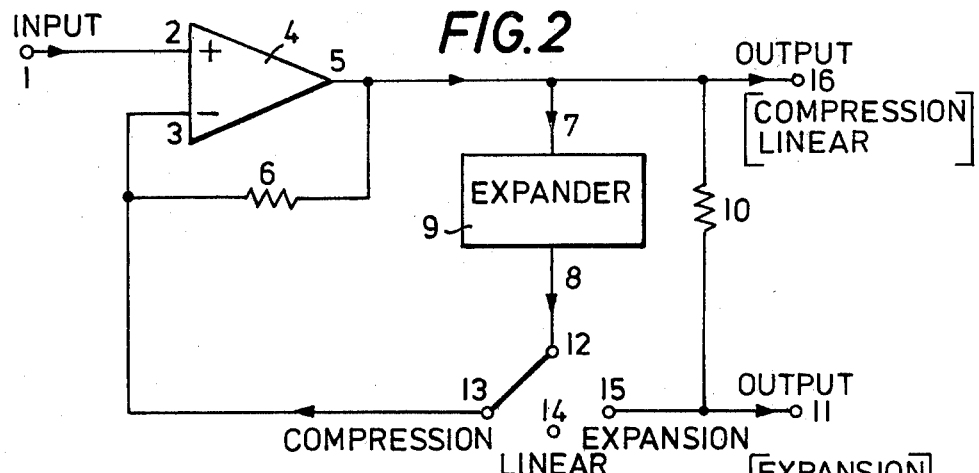

If it is desired that, instead of the one common output terminal 11 in the circuit arrangement according to FIG. 1, separate outputs are to be provided for each of the two modes of operation 'compression' and 'expansion' then the circuit arrangement according to FIG. 1 may advantageously be modified as shown in FIG. 2. In the circuit arrangements according to FIG. 1 and FIG. 2 the components provided with the same references correspond to one another. As compared with the circuit arrangement according to FIG. 1 the circuit arrangement according to FIG. 2 has a further output terminal 16 connected to the output 5 of the amplifier 4, at which terminal a compressed useful signal can be taken off with the setting 13 of the selector switch 12. In the setting 15 of the selector switch 12 ('expansion') the expanded useful signal can be taken off at the output terminal 11. In the setting 14 of the selector switch 12 ('linear') there can be taken off both at the output terminal 16 and at the output terminal 11 a useful signal which is unaltered as regards its dynamic range.

Figure 3:
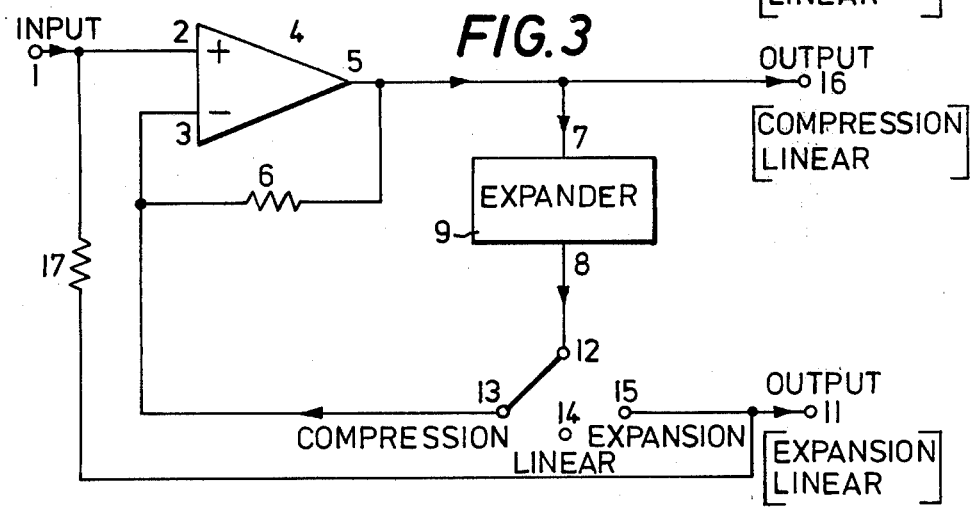

In FIG. 3 is illustrated a further practical example of the circuit arrangement according to the invention which differs from the circuit arrangement illustrated in FIG. 2 only in that the output terminal 11, instead of being connected to the output 5 of the amplifier 4 via a feed-through resistor 10 is here connected via a resistor 17 to the input terminal. Also, in this circuit arrangement according to FIG. 3, in the setting 14 ('linear') of the selector switch 12 there can be taken off both at the output terminal 16 and at the output terminal 11 a useful signal which is linear, i.e. is unaltered in its dynamic range. The resistor 17 prevents the auxiliary circuit 9, in the setting 15 of the selector switch 12, from being short-circuited by the connection of the output terminal 11 to the input terminal 1.

Figure 4:
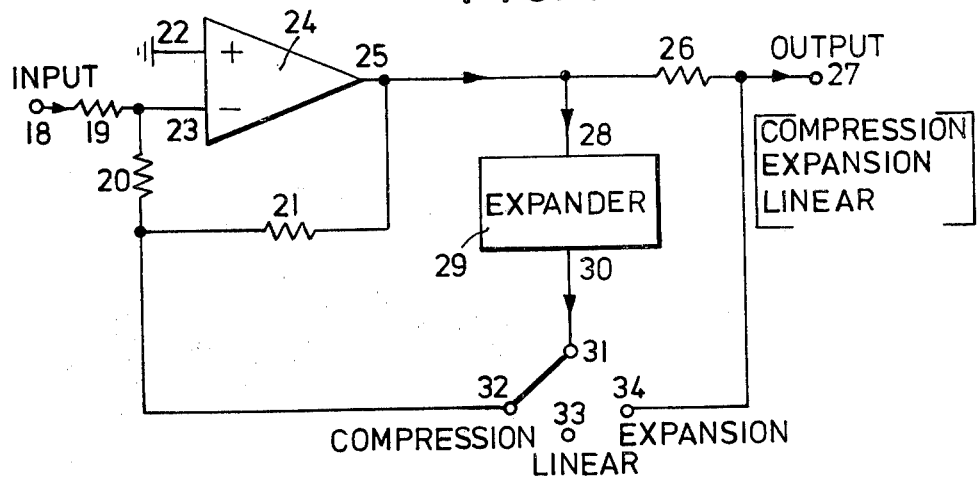

A further practical example of the circuit arrangement according to the invention is illustrated in FIG. 4. Instead of using a non-inverting amplifier relative to the useful signal as in the circuit arrangement according to FIGS. 1 to 3, in the circuit arrangement according to FIG. 4 the useful signal is applied to an input terminal 18 which is connected to the inverting input 23 of the amplifier 24 constructed as a differential amplifier. The non-inverting input 22 of the amplifier 24 is connected to ground. Between the input terminal 18 and the inverting input 23 of the amplifier 24 is connected a resistor 19. The inverting input 23 is further connected to the output 25 of the amplifier 24 via series-connected auxiliary feed-back and feed-back resistors 20 and 21 respectively, so that negative feed-back is effected.

The output 25 of the amplifier 24 is connected on the one hand to an output terminal 27 via a resistor 26 and on the other hand to the input 28 of an auxiliary circuit 29. The auxiliary circuit 29 is of the same construction as the auxiliary circuit 9 in the circuit arrangements according to FIGS. 1 to 4. The auxiliary circuit 29 has the same function as the said auxiliary circuit 9.

The output 30 of the auxiliary circuit 29, which is constructed as an expansion circuit and has a very low ohmic output, is connected to the input of a selector switch 31 which corresponds to the selector switch 12 in e.g. the circuit arrangement according to FIG. 1.

In the setting 32 ('compression') of the selector switch 31 the auxiliary circuit 29 is connected in parallel with the feed-back resistor 21 owing to the output 32 of the selector switch 31 being connected to the junction of the resistors 20 and 21. This setting of the selector switch 31 corresponds to the setting 13 of the selector switch 12 in e.g. the circuit arrangement according to FIG. 1. Since the auxiliary circuit 29, constructed as an expansion circuit in the case described, is located in the negative feed-back branch of the amplifier 24, the useful signal that can be taken off at the output 25 and hence also at the output terminal 27 is compressed as compared with the useful signal on the input terminal 18, i.e. the circuit arrangement operative between the terminals 18 and 27 operates as a compression circuit. The resistors 19 and 20 have the effect that the connection of the low ohmic output 30 of the auxiliary circuit 29 to the inverting input 23 of the amplifier 24 disturbs or suppresses the feeding to the inverting input 23 of the useful signal to be dealt with. The resistor 19 may, for example, be formed by the output resistor of the circuit controlling the input terminal 18.

In the setting 34 ('expansion') of the selector switch 31 the output 30 of the auxiliary circuit 29 is connected directly to the output terminal 27. The operation of the circuit arrangement described corresponds, in this case, to the operation of the circuit arrangement according to FIG. 1 in the setting 15 of the selector switch 12.

In the setting 33 ('linear') of the selector switch 31 the compander action of the circuit arrangement described is switched off. Hence at the output terminal 27 a useful signal can be taken off having a dynamic range that is unaltered compared to the dynamic range of the useful signal on the input terminal 18.

The circuit arrangement according to FIG. 4 is therefore a modification of the circuit arrangement according to FIG. 1 such that instead of an amplifier 4 that does not invert the useful signal, and amplifier 24 inverting the useful signal is used. A corresponding modification of the circuit arrangements according to FIGS. 2 and 3 is also possible.

Figure 5:
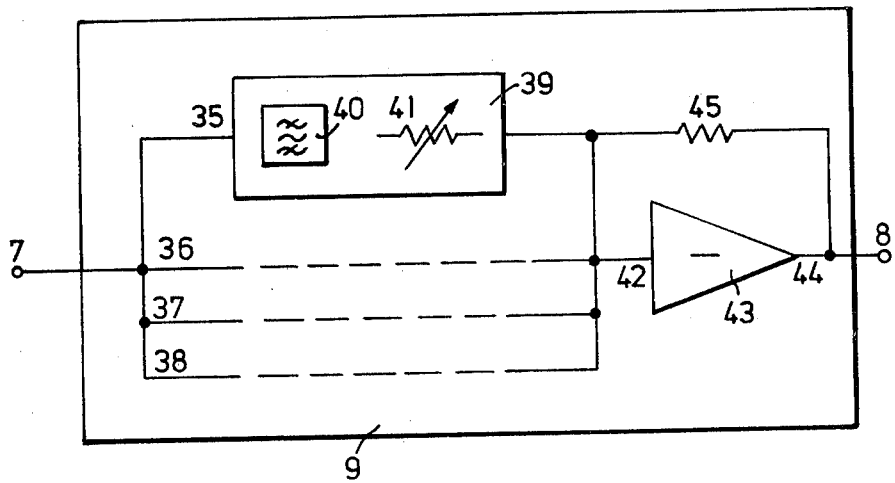
FIG. 5 shows a block circuit diagram of an auxiliary circuit for the circuit arrangements according to FIGS. 1 to 4.

In FIG. 5 is illustrated a practical example of the auxiliary circuit according to FIGS. 1 to 3 as a block circuit diagram. This auxiliary circuit illustrated in FIG. 5 may also be used for the auxiliary circuit 29 in the circuit arrangement according to FIG. 4.

The useful signal fed to the input 7 of the auxiliary circuit 9 is distributed according to frequency over four channels 35 to 38. Each of these four channels includes a circuit arrangement 39 suitable for expansion and each has a filter 40 and a controlled resistor 41. By means of the filters 40 in the channels 35 to 38 the frequency range of the useful signal is distributed over four frequency ranges in each of which dynamic expansion takes place by means of the controllable resistors 41, which expansion is operative independently of the other channels and is without disturbing influence on the other channels. Such circuit arrangements are already known from German patent specification No. 24 06 258, in particular FIG. 8.

The four channels 35 to 38 are brought together at their outputs and are connected to the input 42 of an inverting amplifier 43. The amplifier 43 advantageously consists of a commercially available amplifier with a very high no-load amplification. By means of a resistor 45 the amplifier 43 is provided with a large amount of feed-back back so that the output 44 of the amplifier 43 acts as a voltage source of very low output resistance. This low output resistance is also effective at the output 8 of the auxiliary circuit 9.

In the case of the foregoing practical examples of the circuit arrangement according to the invention the auxiliary circuit 9 or 29 consists of an expansion circuit. However, it is also possible to construct the auxiliary circuits 9 and 29 in such manner that they exhibit the behavior of a compression circuit. If such an auxiliary circuit is then connected in the negative feed-back branch of an amplifier (4, 24) the whole circuit arrangement behaves like an expansion circuit. This case would correspond to the setting 13 of the switch means 12 in the circuit arrangement according to FIG. 1. Correspondingly, in the setting 15 of the switch means 12 in the circuit arrangement according to FIG. 1 a compressed signal can be taken off at the output 11.

The behavior of the circuit arrangements described in FIGS. 1 to 4 when using an auxiliary circuit constructed as a compression circuit (compressor) is easily comprehended if in FIGS. 1 to 4 the term 'compression' is replaced by the term 'expansion' and the term 'expansion' is replaced by the term 'compression'. The behavior of such a circuit arrangement in the setting 14 or 33 ('linear') of the switch means 12 or 31 is the same as in the circuit arrangements according to FIGS. 1 to 4.

What is claimed is:

1. A circuit arrangement for the selective compression or expansion of the dynamic range of an input signal applied to an input terminal and for generating an output signal at a first output terminal, comprising an amplifier having a feed-back resistor connected between its output and input, means coupling the input of said amplifier to said input terminal and means coupling the output of said amplifier to said first output terminal, a dynamic expander having a low resistance output circuit, the input of said expander being coupled to the output of said amplifier, and switching means having first and second positions, said switching means connecting said expander in parallel with said feed-back resistor in said first position to provide compression of the dynamic range of said input signal and connecting said expander to said first output terminal in said second position to provide expansion of the dynamic range of said input signal, said feed-back resistor being connected across said amplifier regardless of the position of said switching means.

2. A circuit arrangement as defined in claim 1 wherein said means coupling the output of said amplifier to said output terminal is an output resistor.

3. A circuit arrangement as defined in claim 2 wherein a second output terminal is connected to the junction of said amplifier and said output resistor, said input signal being dynamically compressed for generation at said second output terminal when said switching means is in said first position and said input signal being dynamically expanded for generation at said first output terminal when said switching means is in said second position.

4. A circuit arrangement as defined in claim 2 wherein the resistance of the output circuit of said dynamic expander is substantially equal to zero.

5. A circuit arrangement as defined in claim 1 wherein the value of said feed-back resistor is such that the gain of said amplifier is equal to about one.

6. A circuit arrangement as defined in claim 1 wherein said switching means has a third position, the signal at said first output terminal being neither compressed nor expanded when said switching means is in said third position.

7. A circuit arrangement as defined in claim 6 which further comprises a feed-through resistor coupling said input and first output terminals.

8. A circuit arrangement as defined in claim 1 wherein said amplifier is a differential amplifier having non-inverting and inverting inputs, said input terminal being coupled to said non-inverting input and said feed-back resistor being coupled to said inverting input.

9. A circuit arrangement as defined in claim 1 wherein said amplifier is a differential amplifier having non-inverting and inverting inputs, and which further comprises an input resistor coupling said input terminal to said inverting input and an auxiliary feed-back resistor coupling said feed-back resistor to said inverting input, said switching means in said first position coupling the output of said expander to the junction between said feed-back and auxiliary feed-back resistors, the non-inverting input of said differential amplifier being coupled to a reference voltage source.

* * * * *